US012712589B1

(12) United States Patent
White et al.

(10) Patent No.: US 12,712,589 B1
(45) Date of Patent: Aug. 18, 2026

(54) SYSTEM FOR TRANSMITTING AND RECEIVING

(71) Applicant: HRL Laboratories, LLC, Malibu, CA (US)

(72) Inventors: Carson White, Agoura Hills, CA (US); Ryan Quarfoth, Woodland Hills, CA (US)

(73) Assignee: HRL LABORATORIES, LLC, Malibu, CA (US)

( * ) Notice: Subject to any disclaimer, the term of this patent is extended or adjusted under 35 U.S.C. 154(b) by 518 days.

(21) Appl. No.: 18/312,954

(22) Filed: May 5, 2023

Related U.S. Application Data

(60) Provisional application No. 63/339,074, filed on May 6, 2022.

(51) Int. Cl.
*H04B 1/44* (2006.01)
*H03F 3/24* (2006.01)

(52) U.S. Cl.
CPC ............... *H04B 1/44* (2013.01); *H03F 3/245* (2013.01); *H03F 2200/294* (2013.01); *H03F 2200/451* (2013.01)

(58) Field of Classification Search
CPC .......... H04B 1/40; H04B 1/403; H04B 1/406; H04B 1/28; H04B 1/30; H04B 1/583; H04B 1/123; H04B 1/7183; H04B 10/116; H04B 1/005; H04B 1/006; H04B 1/38; H04B 1/408; H04B 10/1141; H04B 10/1149; H04B 1/302; H04B 1/405
USPC .......................................................... 455/78
See application file for complete search history.

(56) References Cited

U.S. PATENT DOCUMENTS

| | | | | |
|---|---|---|---|---|
| 8,355,460 | B2 | 1/2013 | Dickey | |
| 9,571,132 | B1 | 2/2017 | Hershberger | |
| 2004/0048634 | A1* | 3/2004 | Satoh | H04B 1/006 455/562.1 |
| 2006/0084403 | A1* | 4/2006 | Gilsdorf | H03F 3/24 455/241.1 |
| 2015/0099474 | A1* | 4/2015 | Yarga | H01Q 1/2266 455/77 |
| 2020/0274575 | A1* | 8/2020 | Yang | H03H 11/28 |

OTHER PUBLICATIONS

Campbell, C. F. et al., “Wideband High Power GaN on SiC SPDT Switch MMICs”, IMS 2010, 2010, pp. 145-148, IEEE.

(Continued)

*Primary Examiner* — Ajibola A Akinyemi
(74) *Attorney, Agent, or Firm* — Lewis Roca Rothergerber Christie LLP

(57) ABSTRACT

A system for transmitting and receiving. In some embodiments, the system includes a radio-frequency current source power amplifier, a buffer amplifier, and a transmit-receive switch. The transmit-receive switch may have a transmit port connected to an output of the radio-frequency current source power amplifier, a receive port connected to an input of the buffer amplifier, and a common port. The transmit-receive switch may be configured: in a first state, to connect the radio-frequency current source power amplifier to the common port; and in a second state, to connect the buffer amplifier to the common port.

17 Claims, 9 Drawing Sheets

(56) References Cited

OTHER PUBLICATIONS

Imam, M. et al., "Efficacy of GaN-on-Si Technology for Realizing Commercially Viable Monolithic Bi-Directional Switches", IS02.2, Mar. 22, 2022, pp. 1-23.
Kinoshita, Y. et al., "100 A Solid State Circuit Breaker Using Monolithic GaN Bidirectional Switch with Two-Step Gate-Discharging Technique", 2020, pp. 652-657, IEEE.
Lal, R. et al., "GaN Four Quadrant Switches: Ready For Prime Time?", IS02.3, Mar. 22, 2022, 28 pages.
Morita, T. et al., "650V 3.1mΩ$cm^2$ GaN-based Monolithic Bidirectional Switch Using Normally-off Gate Injection Transistor", 2007, pp. 865-868, IEEE.
Sievenpiper, D. F. et al., "Experimental Validation of Performance Limits and Design Guidelines for Small Antennas", IEEE Transactions on Antennas and Propagation, Sep. 15, 2011, pp. 8-19, vol. 60, No. 1, IEEE.
Veliadis, V., "Wide-Bandgap Bidirectional Switches and Key Applications", IS02.1, Mar. 22, 2022, pp. 1-34.

* cited by examiner

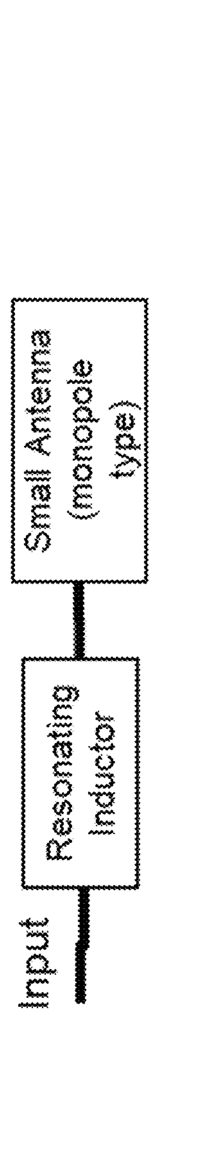
FIG. 1C
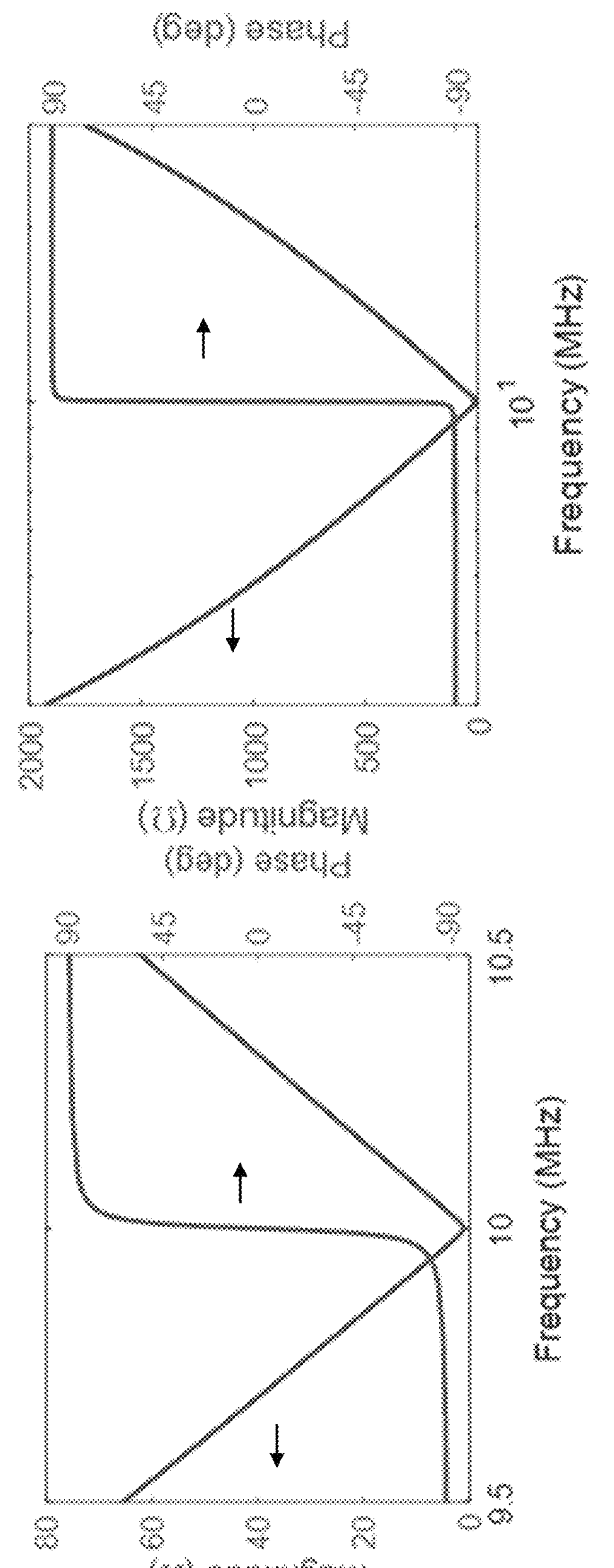
FIG. 1D
FIG. 1E

SYSTEM FOR TRANSMITTING AND RECEIVING

CROSS-REFERENCE TO RELATED APPLICATION(S)

The present application claims priority to and the benefit of U.S. Provisional Application No. 63/339,074, filed May 6, 2022, entitled "ACTIVE TRANSMIT AND RECEIVE FRONTEND", the entire content of which is incorporated herein by reference.

STATEMENT REGARDING FEDERALLY SPONSORED RESEARCH OR DEVELOPMENT

This invention was made with Government support under Contract No. N6600122C4505 awarded by Naval Information Warfare Center. The Government has certain rights in the invention.

FIELD

One or more aspects of embodiments according to the present disclosure relate to electronic circuits, and more particularly to a system for transmitting and receiving.

BACKGROUND

In various applications, it may be advantageous to transmit and receive radio signals with an electronic circuit. Efficiency may be important when transmitting, and noise figure may be important when receiving.

It is with respect to this general technical environment that aspects of the present disclosure are related.

SUMMARY

According to an embodiment of the present disclosure, there is provided a system, including: a radio-frequency current source power amplifier; a buffer amplifier; and a transmit-receive switch, the transmit-receive switch having a transmit port connected to an output of the radio-frequency current source power amplifier, a receive port connected to an input of the buffer amplifier, and a common port, the transmit-receive switch being configured: in a first state, to connect the radio-frequency current source power amplifier to the common port; and in a second state, to connect the buffer amplifier to the common port.

In some embodiments, the buffer amplifier has an input impedance greater than 100 ohms.

In some embodiments, the transmit-receive switch is a single-pole double-throw switch.

In some embodiments, the system further includes an antenna operatively coupled to the common port of the transmit-receive switch.

In some embodiments, the antenna is a monopole antenna.

In some embodiments, the system further includes an inductor or a capacitor, connected between the common port of the transmit-receive switch and the antenna.

In some embodiments, the inductor is a variable inductor.

In some embodiments, the buffer amplifier includes a common-source amplifier.

In some embodiments, the buffer amplifier includes shunt feedback.

According to an embodiment of the present disclosure, there is provided a method for transmitting and receiving with a system, the system including: a radio-frequency current source power amplifier; a buffer amplifier; and a transmit-receive switch, the transmit-receive switch having a transmit port connected to an output of the radio-frequency current source power amplifier, a receive port connected to an input of the buffer amplifier, and a common port, the method including: operating the transmit-receive switch in a transmit mode, the transmit port being connected to the common port in the transmit mode; amplifying, by the radio-frequency current source power amplifier, a first signal; and transmitting the first signal, from the common port, to a load, an electrical path from the radio-frequency current source power amplifier to the load having a length less than one fifth of a wavelength corresponding to a center frequency of the first signal.

In some embodiments, the load includes an antenna.

In some embodiments, the antenna is a monopole antenna.

In some embodiments, the antenna has a first resonance frequency within 30% of the center frequency of the first signal.

In some embodiments, the load further includes an inductor, connected in series with the antenna.

In some embodiments, the inductor is connected between the common port of the transmit-receive switch and the antenna.

In some embodiments, the load has a resonance frequency within 30% of the center frequency of the first signal.

In some embodiments: the buffer amplifier has an input impedance greater than 0.1 times an impedance of the load over a range of frequencies extending from $(1-1/Q)\ f0$ to $(1+1/Q)\ f0$; f0 is the resonance frequency; and Q is the quality factor of the resonance.

In some embodiments, the inductor is a variable inductor.

In some embodiments, the buffer amplifier includes a common-source amplifier.

According to an embodiment of the present disclosure, there is provided a system, including: a radio-frequency current source power amplifier; a buffer amplifier; a transmit-receive switch; and a load, the transmit-receive switch having a transmit port connected to an output of the radio-frequency current source power amplifier, a receive port connected to an input of the buffer amplifier, and a common port connected to the load, the transmit-receive switch being configured: in a first state, to connect the radio-frequency current source power amplifier to the common port; and in a second state, to connect the buffer amplifier to the common port, an input impedance of the buffer amplifier having a magnitude greater than 0.1 times a magnitude of a resonant impedance of the load.

In some embodiments, the load includes a self-resonant antenna.

In some embodiments, the load includes an antenna connected in series with an inductor or a capacitor.

BRIEF DESCRIPTION OF THE DRAWINGS

These and other features and advantages of the present disclosure will be appreciated and understood with reference to the specification, claims, and appended drawings wherein:

FIG. 1C is a block diagram of a load, according to an embodiment of the present disclosure;

FIG. 1D is a graph of impedance as a function of frequency, according to an embodiment of the present disclosure;

FIG. 1E is a graph of impedance as a function of frequency, according to an embodiment of the present disclosure;

DETAILED DESCRIPTION

The detailed description set forth below in connection with the appended drawings is intended as a description of exemplary embodiments of a system for transmitting and receiving provided in accordance with the present disclosure and is not intended to represent the only forms in which the present disclosure may be constructed or utilized. The description sets forth the features of the present disclosure in connection with the illustrated embodiments. It is to be understood, however, that the same or equivalent functions and structures may be accomplished by different embodiments that are also intended to be encompassed within the scope of the disclosure. As denoted elsewhere herein, like element numbers are intended to indicate like elements or features.

Monopole type antennas are attractive due to their simplicity, robustness and ease of implementation. This class of antennas includes whips, masts, blades, and normal mode helices, among others. In transmit mode the radiated field of such an antenna may (to first order) be directly proportional to the antenna current. Similarly, in receive mode, the open circuit voltage may be directly proportional to the incident electric field. The first order equivalent circuit (below resonance) is the radiation resistance in series with a capacitor. If the antenna is driven by an ideal current source in transmit mode, then the radiation will be independent of the frequency effects of the capacitance. Likewise, if the voltage can be sensed at the terminals using a low-noise amplifier having an input impedance much greater than the impedance of the capacitor, then the received signal will also be independent of the frequency effects of the capacitor.

Figures 1A, 1B:
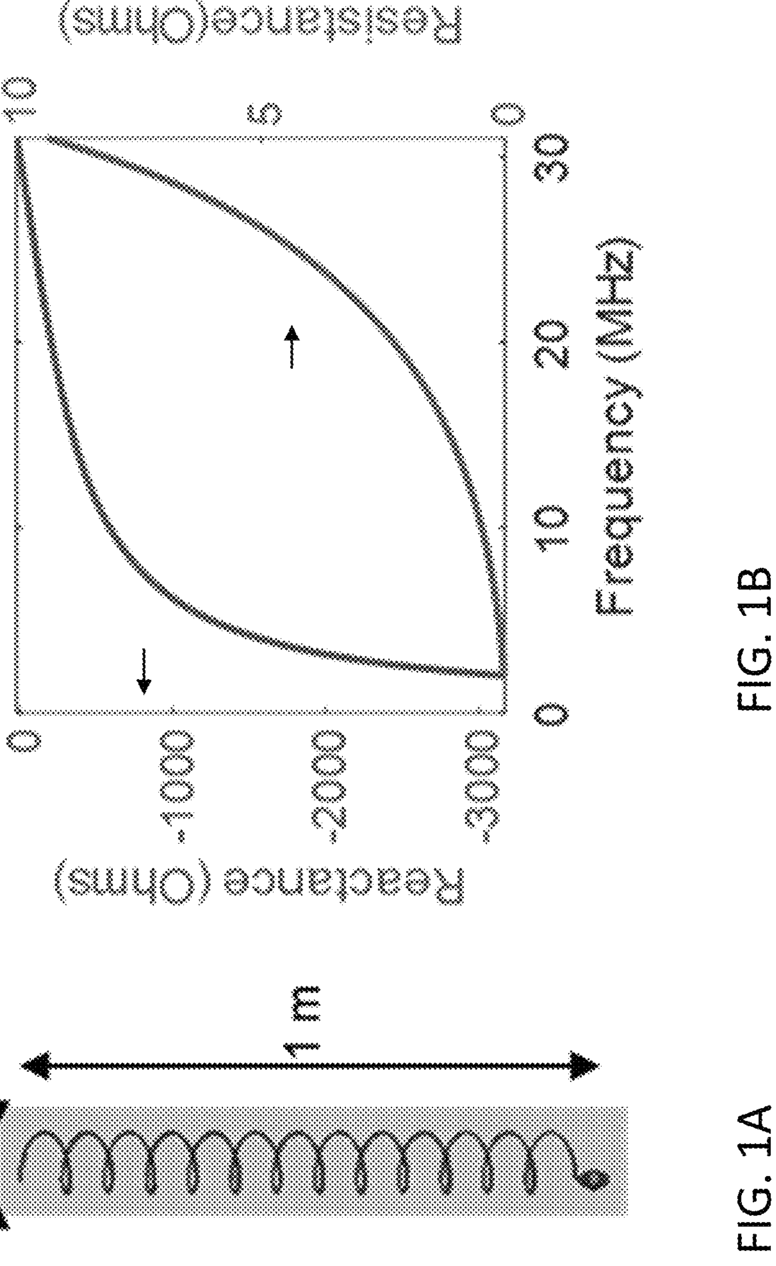
FIG. 1A is a perspective view of an antenna, according to an embodiment of the present disclosure.
FIG. 1B is a graph of impedance as a function of frequency, according to an embodiment of the present disclosure.

FIG. 1A shows an example monopole type antenna, a normal mode helix, configured to be 1 m tall and resonating at 30 MHz. FIG. 1B shows the reactance and resistance components of the antenna, as a function of frequency. The radiation resistance at 10 MHz is approximately 0.44 Ohms and the reactance of the antenna capacitance is −585 Ohms. While an ideal current source can drive this high impedance, achieving this level of impedance is difficult in practice. Furthermore, the voltage required to drive current into the antenna may become very large: I=sqrt(power/resistance), |V|=|I|*|impedance|. Therefore, it may be advantageous to resonate the antenna near a desired transmit frequency using a series inductor (FIG. 1C). Doing this may reduce the magnitude of the impedance by a factor of 9 to 10 over a large bandwidth (FIG. 1D), making wideband transmission with a current source practical. It is apparent from the Bode-Fano limit that because the quality factor Q (approximated as the ratio of reactance to resistance) is 1300 at 10 MHz, the bandwidth available for conjugate matching is very small. FIG. 1D illustrates this for single-tuning (i.e. a single resonance) where a conjugate match is achieved over the bandwidth where the resistance is relatively constant at 0.44 Ohms and the phase is between (+45 and −45 degrees). More complicated double tuned matching networks can improve the bandwidth by a factor of 2.3. The physical limit for a perfect matching network could provide 3.8 times more bandwidth. FIG. 1E, which is a graph of the same impedance data over the entire high frequency (HF) band, shows that the magnitude of the impedance is less than 2 kiloohms (kΩ). This is relevant to receive mode, as discussed below. In some embodiments an antenna that is inductive at low frequencies (e.g., a loop antenna) may be used instead of a monopole antenna, and a series capacitor may be used to resonate the antenna.

Figure 2:
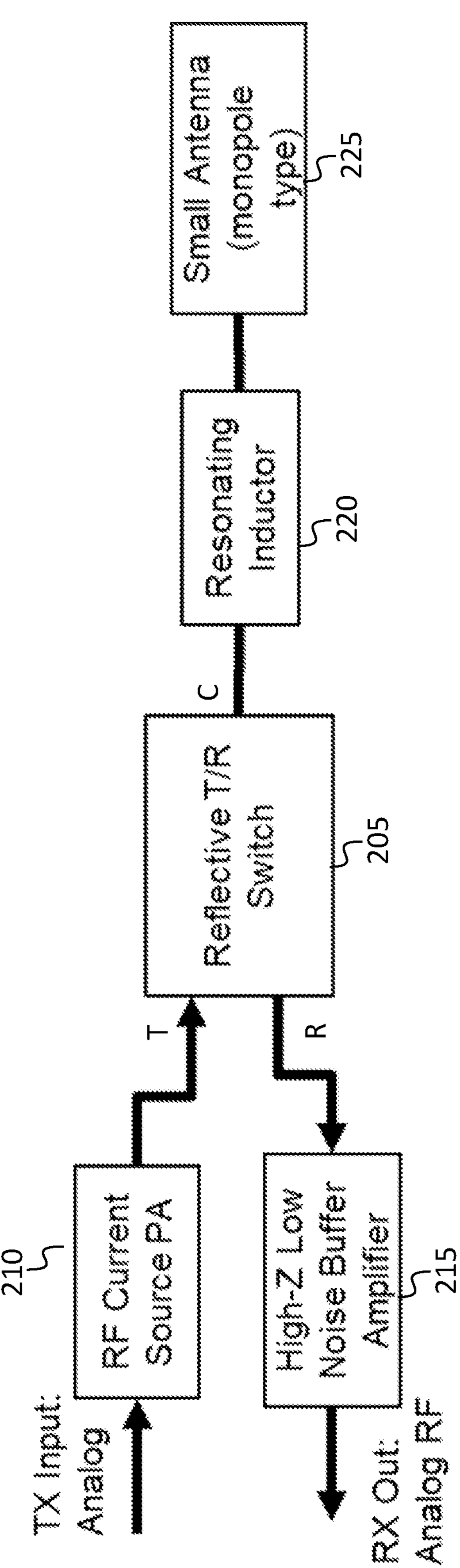
FIG. 2 is a block diagram of a system for transmitting and receiving, according to an embodiment of the present disclosure.

The architecture of some embodiments is shown in FIG. 2. A transmit/receive (T/R) switch 205 has at least three sets of terminals. A first set of terminals, denoted "T", is coupled to the output of a radio frequency current source power amplifier (RFCS PA) 210, a second set of terminals, denoted "R", is coupled to the input terminals of a high impedance low-noise buffer amplifier 215, and a third set of terminals, denoted "C", for "common", is configured to be coupled to a radiating device, such a resonating inductor 220 connected in series with an antenna 225. The switch may operate in two states, or "modes". In a first mode, which may be referred to as "T" mode, the T and C terminals are coupled and the R terminals are isolated. In a second, "R" mode, the R and C terminals are coupled and the T terminals are isolated. In this way, the half-duplex front end directly connects either the transmit or receive electronics to the common terminal at any given time. In some embodiments, the T/R switch is a single-pole double-throw (SPDT) radio frequency switch. The switch may be configured to be capable of switching fast enough to switch between transmit and receive chains according to a desired protocol, for example, a time domain duplex communication protocol. Coupled means electromagnetically coupled, for example by means of wires, cables, or printed circuit board traces, or by capacitive or coupled inductance (i.e. transformer) coupling. In some embodiments, the electrical length of the connections (i) between the switch and the radio frequency current source power amplifier 210, (ii) between the switch and the high impedance low-noise buffer amplifier 215, and (iii) between the switch and the circuit (e.g., the radiating device, which may be the series combination of the resonating inductor 220 and the antenna 225) connected to the C port of the transmit/receive switch 205 is less than a fifth of a wavelength (e.g., less than a tenth of a wavelength) so as to avoid standing wave behavior. Furthermore, because the radio frequency current source power amplifier 210 and the high impedance low-noise buffer amplifier 215 have high output impedance and input impedance respectively, it may be advantageous to control the parasitic shunt impedances of the transmit/receive switch 205 and of the interconnects.

Figures 3A, 3B:
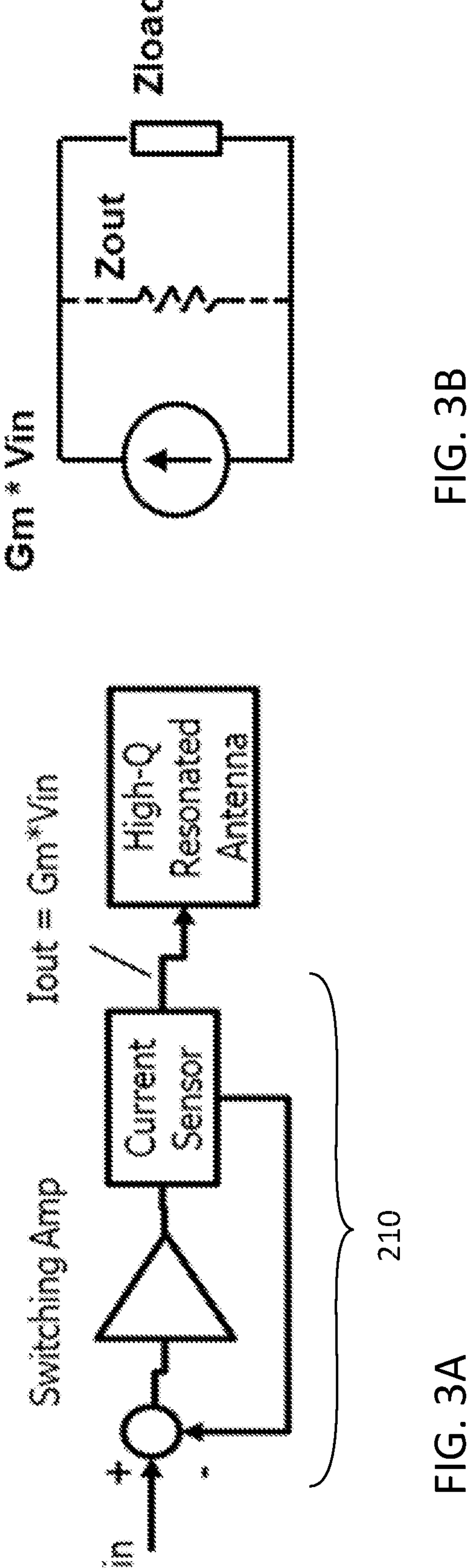
FIG. 3A is a block diagram of a portion of a system for transmitting and receiving, according to an embodiment of the present disclosure.
FIG. 3B is an equivalent circuit diagram, according to an embodiment of the present disclosure.

The radio frequency current source power amplifier 210 may be configured to output a current in proportion to an input signal into a dispersive or mismatched load. This effectively means that it has a high output impedance. Examples of amplifiers that may have high output impedance include transconductance amplifiers, feedback amplifiers, and amplifiers with predistortion based on a model of the load (see FIG. 3A). The radio frequency current source power amplifier 210 may be modeled as an ideal current source in parallel with a Norton equivalent output impedance, as illustrated in FIG. 3B. This is a virtual impedance and, in some embodiments, does not dissipate power. The calculated frequency response into the resonated antenna assuming Zout=500 Ohms is plotted in FIG. 4A. Since Zout is much greater than 60 Ohms (the impedance at +/−0.5 MHz from center), the frequency response with the radio frequency current source power amplifier 210 is nearly flat over the 1 MHz bandwidth. This behavior is distinct from that of a circuit using conjugate matching, which provides extremely narrow bandwidth. The slope is due to the non-constant radiation resistance, which is a second order effect. The voltage at the band edges may be significantly higher, and power handling may be traded off against bandwidth.

The design chosen for the radio frequency current source power amplifier 210 may have a large impact on the system efficiency. For example, a radio frequency current source power amplifier 210 based on a class A amplifier may have low efficiency while a radio frequency current source power amplifier 210 based on a high efficiency switching mode amplifier may have an efficiency improvement of a factor of 10 or more when deviating from the center of the band. This difference in efficiency is exhibited because operating beyond the center frequency means the radio frequency current source power amplifier 210 supplies a large amount of reactive power. To first order, the amplifier efficiency may be calculated as the ratio of real to apparent power; as such, a class A amplifier may dissipate more than half of the apparent power.

The resonance frequency may be varied if the resonating inductor of FIGS. 1C and 2 is made to be variable. This may be accomplished, for example, by tap switching of a large inductor, switching discrete inductors in and out, variometers, moving a permeable core inside the inductor, or a combination of such approaches. Such an approach may enable simple frequency tuning because only one variable (a single inductance) is varied. In order to design for frequency tuning, the antenna 225 may be designed such that its first series resonance is at or above the highest frequency of interest (e.g., in FIG. 1A, the helix resonates at 30 MHz). The inductance may then be chosen to have a range such that it resonates the antenna over the desired frequency range. The antenna may be configured to resonate above the highest desired frequency, such that an inductance within the achievable range resonates the antenna at the highest desired frequency.

The antenna need not resonate exactly at the center frequency of a transmission signal. Guidelines that may be followed, to control distortion, are as follows. First, the impedance (Zin) of the antenna and, if included, the resonating inductor should be much less than the output impedance (Zout) of the radio frequency current source power amplifier 210 within the band, such that distortion is minimized. In the example above (FIGS. 1A-1E and FIG. 3), in which Zout=500 ohms and the impedance of the resonated antenna is less than 60 Ohms over the band extending from 9.5 to 10.5 MHz, the condition that Zout is much greater than Zin is met over the whole band. Therefore, any signal having a power spectrum confined to within this band may be transmitted with low distortion. Examples include a 1 MHz bandwidth signal centered at 10 MHz, a 0.5 MHz bandwidth signal centered at 9.75 or 10.25 MHz, or a narrowband signal anywhere in the band. The second guideline is that the voltage sourced by the radio frequency current source power amplifier 210 should be less than the maximum voltage. For example, if the maximum voltage is 100 V, then a narrowband signal at 9.5 and 9.75 MHz will be limited to approximately 1.6 A and 3.3 A, respectively. The limits for broadband signals are more complex, but this illustrates the principle.

In the example circuit of FIG. 3A (an equivalent circuit of which is illustrated in FIG. 3B), the radio frequency current source power amplifier 210 outputs a current in proportion to an input signal despite the fact that the load is highly dispersive. The feedback circuit predistorts the output voltage signal such that the output current is correct. This is equivalent to a current source with a high Norton equivalent output impedance, as illustrated in FIG. 3B.

Figures 4A, 4B:
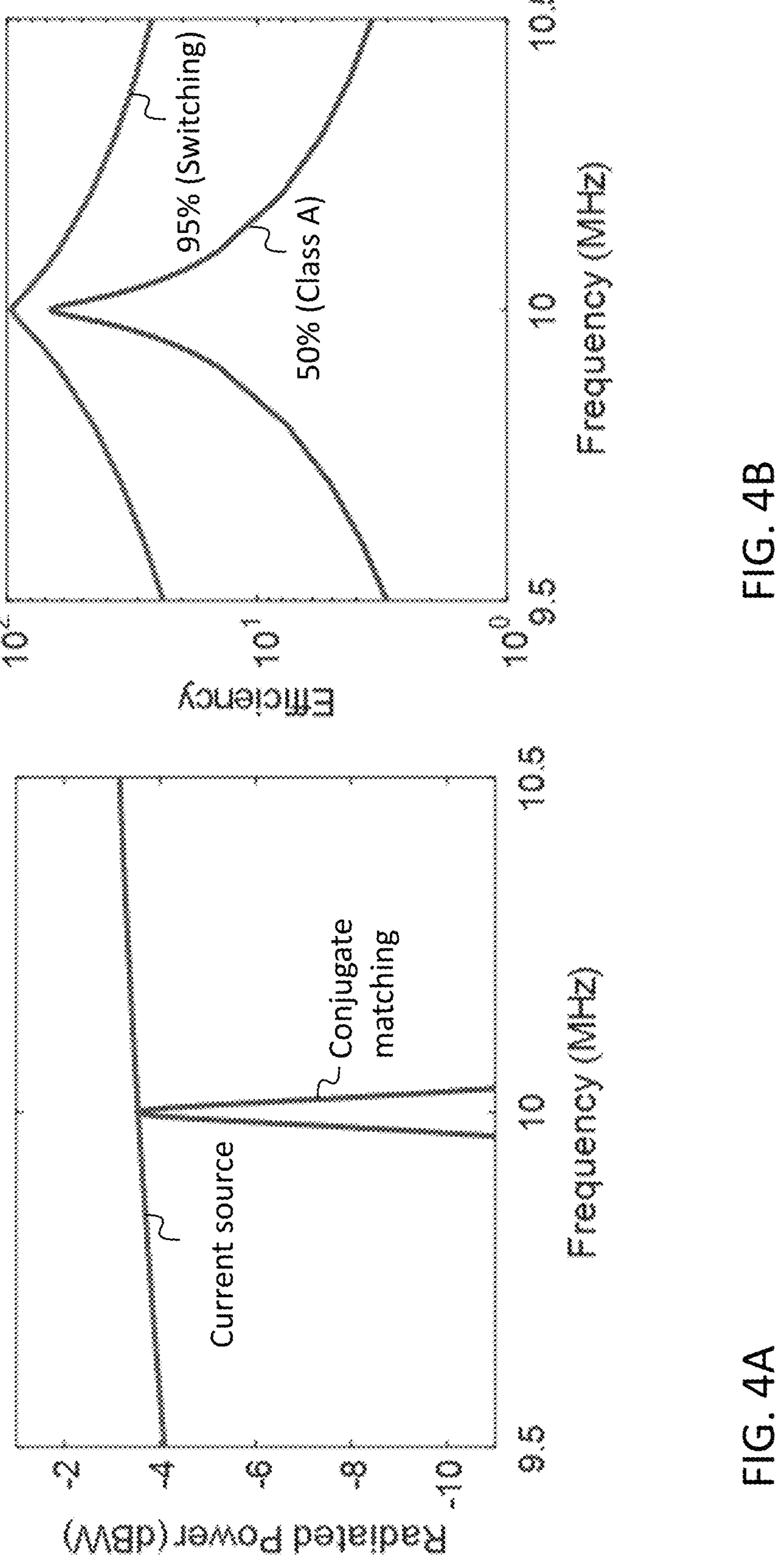
FIG. 4A is a graph of radiated power as a function of frequency, according to an embodiment of the present disclosure.
FIG. 4B is a graph of efficiency as a function of frequency, according to an embodiment of the present disclosure.

FIG. 4A shows radiated power as a function of frequency in two circumstances, (i) one in which the antenna and resonating inductor are driven by a current source (having an output impedance of 500 ohms) and (ii) one in which the antenna and resonating inductor are driven by an impedance-matched source, i.e. with source impedance equal to the resistance of the resonated antenna, which is 0.44 Ohms in this case. FIG. 4B shows the efficiency (the ratio of (i) radiated power to (ii) electrical power supplied to the circuit), when a current source drive circuit is used, in two circumstances, (i) one in which the amplifier is a class A amplifier, and (ii) one in which the amplifier is a switching amplifier.

The high impedance low-noise buffer amplifier 215 is configured to have input impedance higher than one-tenth of the input impedance of the resonated antenna (e.g., higher than 0.25 of the input impedance of the resonated antenna, or higher than the input impedance of the resonated antenna). In the example of FIGS. 1A-1E, for example, the high impedance low-noise buffer amplifier 215 may be configured to have input impedance higher than 2 kΩ. Because the resonated antenna and the buffer input form a voltage divider, the wideband gain may be maximized when the input impedance is much greater than resonated antenna impedance and may degrade when the input impedance is less than the resonated antenna impedance. A high input impedance may be accomplished with a common source amplifier based on a high electron mobility transistor, which naturally has high capacitive input impedance. Shunt feedback may be used to make the input impedance resistive, which may be beneficial to avoid strong resonances (see FIG. 5B, discussed in further detail below). This type of buffer may be directly connected to the antenna. However, connecting it after the resonating inductor may reduce the voltage stress during transmit. For example, with 1 A transmit current, the antenna base has 585 V, but the transmit/receive switch 205 is exposed to less than 60 V. Assuming the switch can provide 20 dB of isolation, the high impedance low-noise buffer amplifier 215 is subjected to 6 V (the voltage to which it would be subjected would instead be 59 V if the transmit/receive switch 205 were connected between the resonating inductor 220 and the antenna 225).

Three cases were simulated, all with a high impedance low-noise buffer amplifier 215 having a gain of 14.4 dB.

Figures 5A, 5B:
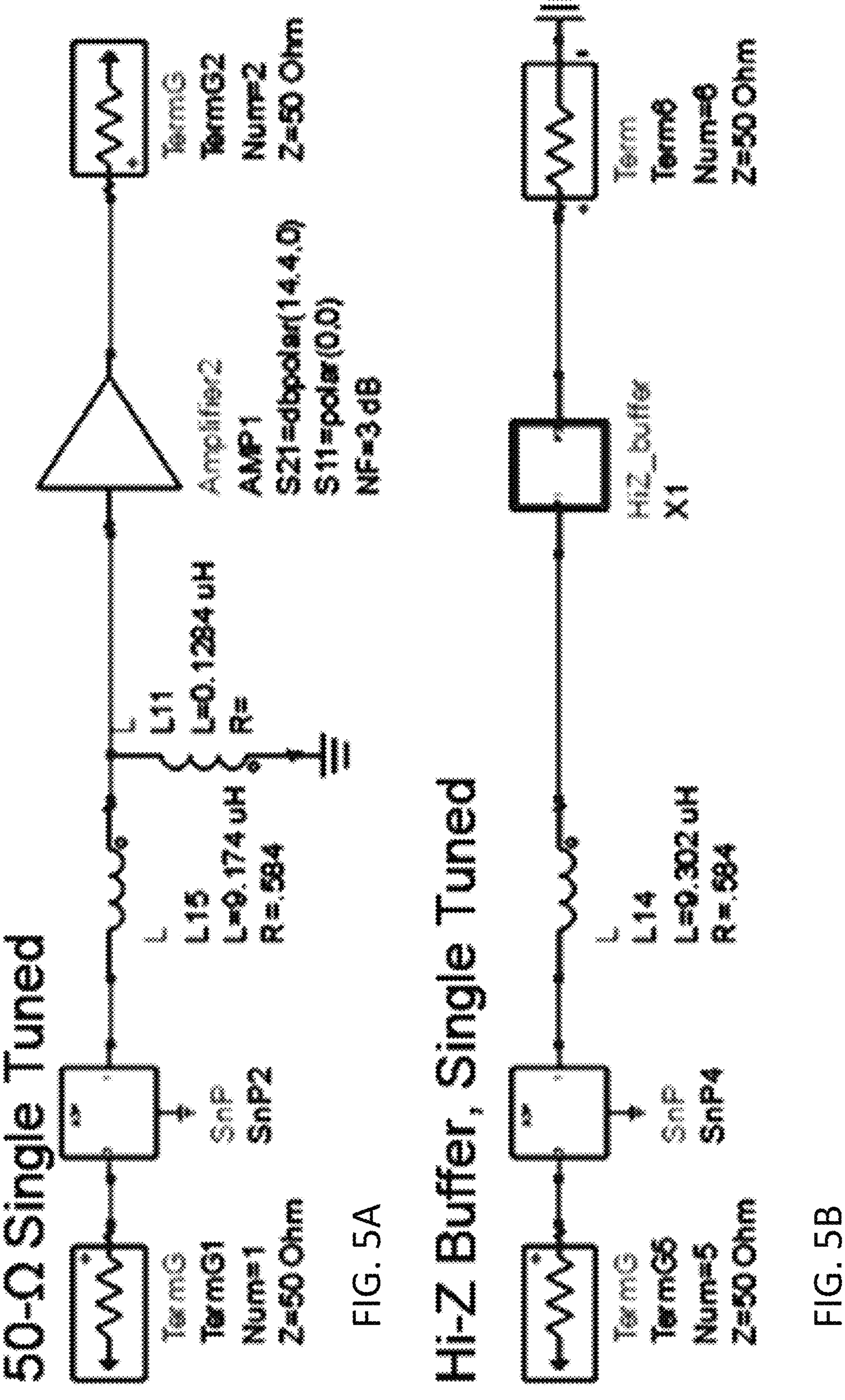
FIG. 5A is a schematic diagram employed for a simulation, according to an embodiment of the present disclosure.
FIG. 5B is a schematic diagram employed for a simulation, according to an embodiment of the present disclosure.
Figure 5C:
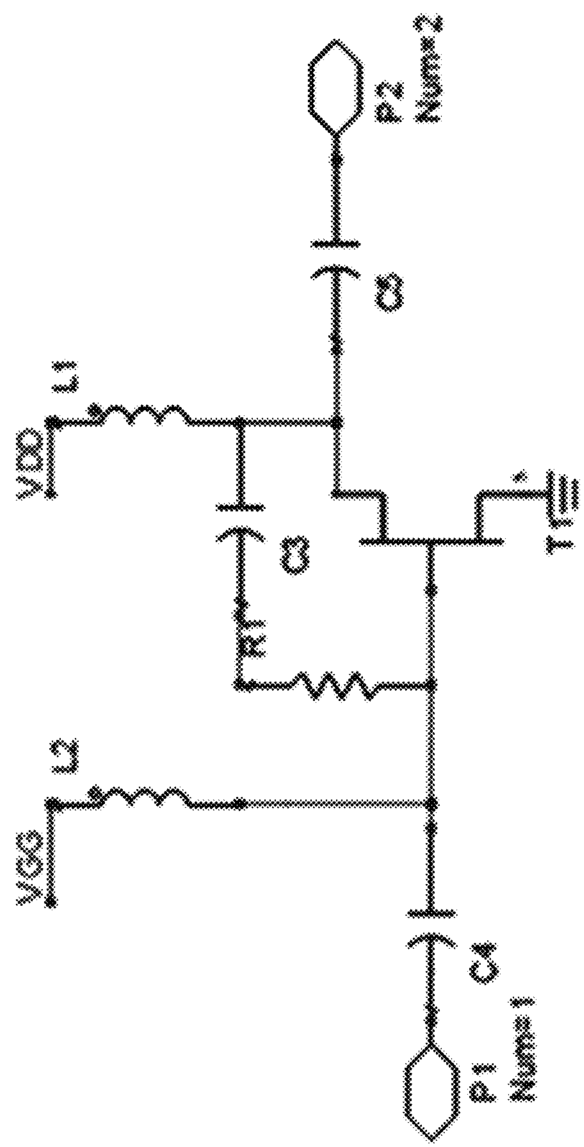
FIG. 5C, is a schematic diagram of a buffer amplifier, according to an embodiment of the present disclosure.
Figure 6A:
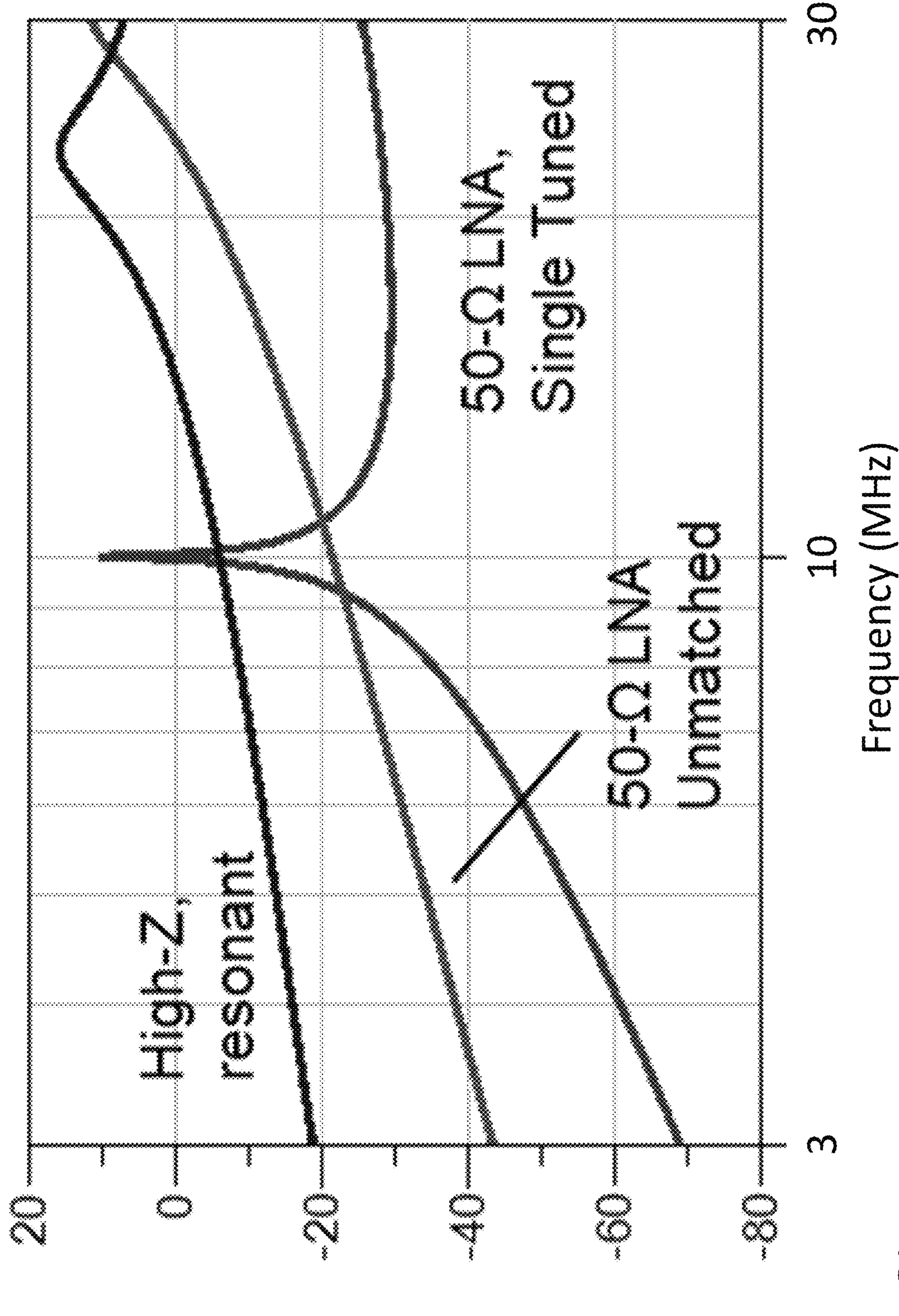
FIG. 6A is a graph of simulation results, according to an embodiment of the present disclosure.
Figure 6B:
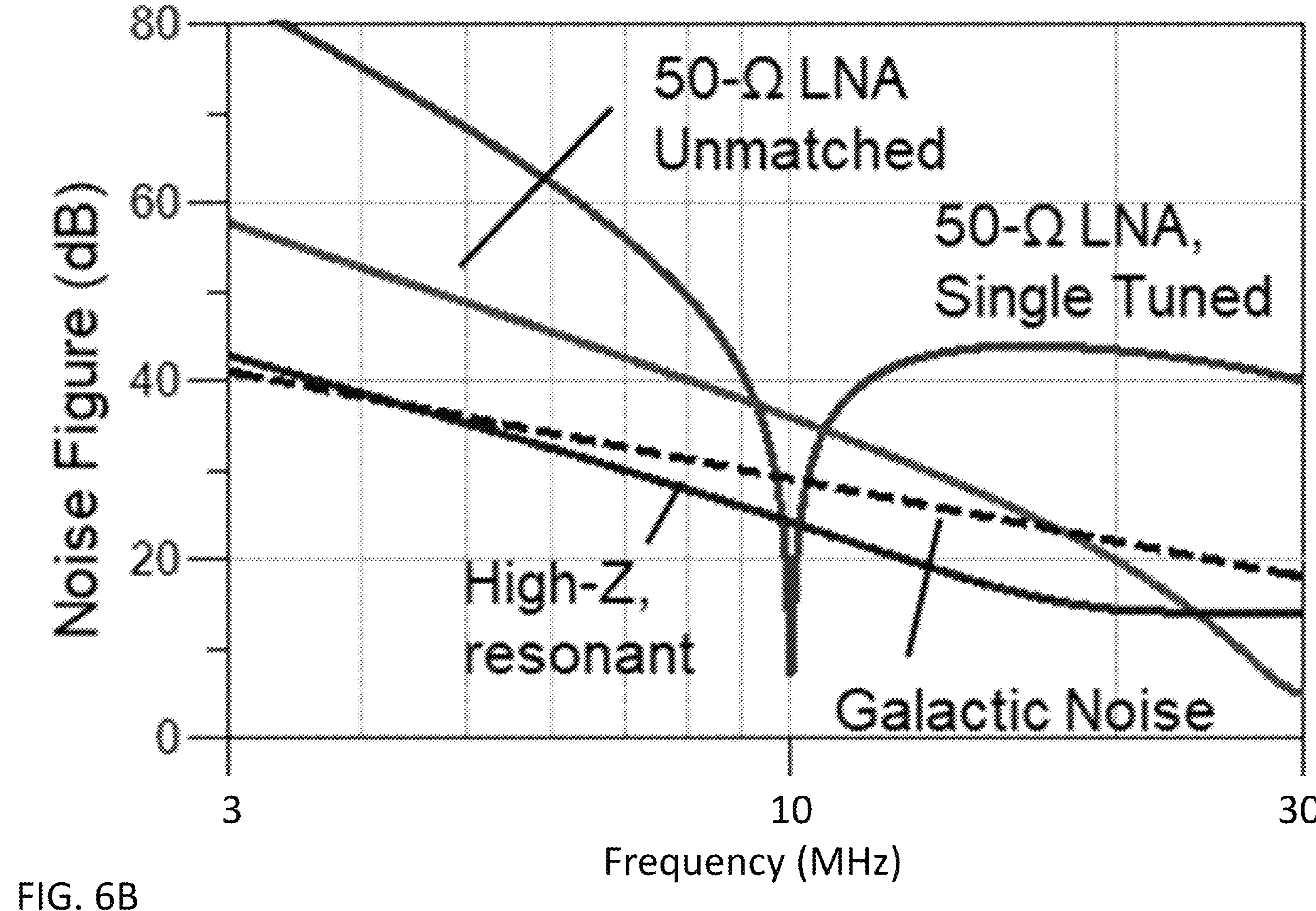
FIG. 6B is a graph of simulation results, according to an embodiment of the present disclosure.

FIG. 5A shows the simulation setup for a first comparison case. A second comparison case (described below) was also simulated. FIG. 5B shows the simulation setup for simulating one embodiment, and FIG. 5C shows the circuit of the high impedance low-noise buffer amplifier 215 used in the circuit of FIG. 5B for the simulation. The circuit of FIG. 5C is one example of the circuit of a high impedance low-noise buffer amplifier 215; in some embodiments a different circuit may be used. In FIGS. 5A and 5B, the blocks labeled "SnP" are a model of the antenna. The two comparison cases have a 3 dB noise figure, whereas the high impedance case has a simulation of a high impedance low-noise buffer amplifier 215 according to FIG. 5C. The open circuit voltage of the antenna below resonance is flat with frequency, but the antenna gain varies at 20 dB/decade due to the non-constant radiation resistance. In the first comparison case, (labeled "50-Ω LNA, Single Tuned" in FIGS. 6A and 6B), a narrow band match was made that gives the highest gain at the center frequency and the lowest noise figure. In the second comparison case (labeled "50-Ω LNA Unmatched" in FIGS. 6A and 6B), the antenna is connected to a 50 ohm low noise amplifier (LNA). The antenna capacitance adds another zero to the frequency response such that it varies at 40 dB/decade. In the third case (FIGS. 5B and 5C, with results labeled "High-Z, resonant" in FIGS. 6A and 6B), the antenna is connected to the high impedance low-noise buffer amplifier 215 through a resonating inductor. The high impedance low-noise buffer amplifier 215 has much higher gain than the 50 ohm case because it mitigates the effect of the antenna reactance. It has much lower noise figure than the 50 ohm case over the band.

As used herein, "a portion of" something means "at least some of" the thing, and as such may mean less than all of, or all of, the thing. As such, "a portion of" a thing includes the entire thing as a special case, i.e., the entire thing is an example of a portion of the thing. As used herein, when a second quantity is "within Y" of a first quantity X, it means that the second quantity is at least X-Y and the second quantity is at most X+Y. As used herein, when a second number is "within Y %" of a first number, it means that the second number is at least (1−Y/100) times the first number and the second number is at most (1+Y/100) times the first number. As used herein, the word "or" is inclusive, so that, for example, "A or B" means any one of (i) A, (ii) B, and (iii) A and B.

As used herein, when a method (e.g., an adjustment) or a first quantity (e.g., a first variable) is referred to as being "based on" a second quantity (e.g., a second variable) it means that the second quantity is an input to the method or influences the first quantity, e.g., the second quantity may be an input (e.g., the only input, or one of several inputs) to a function that calculates the first quantity, or the first quantity may be equal to the second quantity, or the first quantity may be the same as (e.g., stored at the same location or locations in memory as) the second quantity.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed herein could be termed a second element, component, region, layer or section, without departing from the spirit and scope of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that such spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the terms "substantially," "about," and similar terms are used as terms of approximation and not as terms of degree, and are intended to account for the inherent deviations in measured or calculated values that would be recognized by those of ordinary skill in the art.

As used herein, the singular forms "a" and "an" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. Further, the use of "may" when describing embodiments of the inventive concept refers to "one or more embodiments of the present disclosure". Also, the term "exemplary" is intended to refer to an example or illustration. As used herein, the terms "use," "using," and "used" may be considered synonymous with the terms "utilize," "utilizing," and "utilized," respectively.

It will be understood that when an element or layer is referred to as being "on", "connected to", "coupled to", or "adjacent to" another element or layer, it may be directly on, connected to, coupled to, or adjacent to the other element or layer, or one or more intervening elements or layers may be present. In contrast, when an element or layer is referred to as being "directly on", "directly connected to", "directly coupled to", or "immediately adjacent to" another element or layer, there are no intervening elements or layers present.

Any numerical range recited herein is intended to include all sub-ranges of the same numerical precision subsumed within the recited range. For example, a range of "1.0 to 10.0" or "between 1.0 and 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Similarly, a range described as "within 35% of 10" is intended to include all subranges between (and including) the recited minimum value of 6.5 (i.e., (1−35/100) times 10) and the recited maximum value of 13.5 (i.e., (1+35/100) times 10), that is, having a minimum value equal to or greater than 6.5 and a maximum value equal to or less than 13.5, such as, for example, 7.4 to 10.6. Any maximum numerical limitation recited herein is intended to include all lower numerical limitations subsumed therein and any minimum numerical limitation recited in this specification is intended to include all higher numerical limitations subsumed therein.

It will be understood that when an element is referred to as being "directly connected" or "directly coupled" to another element, there are no intervening elements present. As used herein, "operatively coupled" means connected by an electrical path that may contain arbitrary intervening elements, including intervening elements the presence of which qualitatively changes the behavior of the circuit. As used herein, "connected" means (i) "directly connected" or (ii) connected with intervening elements, the intervening elements being ones (e.g., low-value resistors or inductors, or short sections of transmission line) that do not qualitatively affect the behavior of the circuit.

Although exemplary embodiments of a system for transmitting and receiving have been specifically described and illustrated herein, many modifications and variations will be apparent to those skilled in the art. Accordingly, it is to be understood that a system for transmitting and receiving constructed according to principles of this disclosure may be embodied other than as specifically described herein. The invention is also defined in the following claims, and equivalents thereof.

What is claimed is:

1. A system, comprising:
- a radio-frequency current source power amplifier;
- a buffer amplifier;
- a transmit-receive switch,
- the transmit-receive switch having a transmit port connected to an output of the radio-frequency current source power amplifier, a receive port connected to an input of the buffer amplifier, and a common port,
- the transmit-receive switch being configured:
  - in a first state, to connect the radio-frequency current source power amplifier to the common port; and
  - in a second state, to connect the buffer amplifier to the common port;
- an antenna operatively coupled to the common port of the transmit-receive switch; and
- a resonating inductor directly connected in series with the antenna,
- wherein the buffer amplifier has an input impedance greater than a resonated antenna impedance.

2. The system of claim 1, wherein the input impedance of the buffer amplifier is greater than 100 ohms.

3. The system of claim 1, wherein the transmit-receive switch is a single-pole double-throw switch.

4. The system of claim 1, wherein the antenna is a monopole antenna.

5. The system of claim 1, wherein the resonating inductor is a variable inductor.

6. The system of claim 1, wherein the buffer amplifier comprises a common-source amplifier.

7. The system of claim 6, wherein the buffer amplifier comprises shunt feedback.

8. A method for transmitting and receiving with a system, the system comprising:
- a radio-frequency current source power amplifier;
- a buffer amplifier;
- a transmit-receive switch,
- the transmit-receive switch having a transmit port connected to an output of the radio-frequency current source power amplifier, a receive port connected to an input of the buffer amplifier, and a common port;
- an antenna operatively coupled to the common port of the transmit-receive switch; and
- a resonating inductor directly connected in series with the antenna, the method comprising:
- operating the transmit-receive switch in a transmit mode, the transmit port being connected to the common port in the transmit mode;
- amplifying, by the radio-frequency current source power amplifier, a first signal; and
- transmitting the first signal, from the common port, to the antenna, an electrical path from the radio-frequency current source power amplifier to the antenna having a length less than one fifth of a wavelength corresponding to a center frequency of the first signal, wherein the buffer amplifier has an input impedance greater than a resonated antenna impedance.

9. The method of claim 8, wherein the antenna is a monopole antenna.

10. The method of claim 8, wherein the antenna has a first resonance frequency within 30% of the center frequency of the first signal.

11. The method of claim 8, wherein the inductor is connected between the common port of the transmit-receive switch and the antenna.

12. The method of claim 8, wherein the antenna has a resonance frequency within 30% of the center frequency of the first signal.

13. The method of claim 12, wherein:
- the input impedance of the buffer amplifier is greater than 0.1 times an impedance of the antenna over a range of frequencies extending from $(1-1/Q)\ f0$ to $(1+1/Q)\ f0$;
- f0 is the resonance frequency; and
- Q is the quality factor of the resonance.

14. The method of claim 8, wherein the inductor is a variable inductor.

15. The method of claim 8, wherein the buffer amplifier comprises a common-source amplifier.

16. A system, comprising:
- a radio-frequency current source power amplifier;
- a buffer amplifier;
- a transmit-receive switch;
- the transmit-receive switch having a transmit port connected to an output of the radio-frequency current source power amplifier, a receive port connected to an input of the buffer amplifier, and a common port;
- an antenna operatively coupled to the common port of the transmit-receive switch; and
- a resonating inductor directly connected in series with the antenna,
- the transmit-receive switch being configured:
  - in a first state, to connect the radio-frequency current source power amplifier to the common port; and
  - in a second state, to connect the buffer amplifier to the common port,
- an input impedance of the buffer amplifier having a magnitude greater than 0.1 times a magnitude of a resonant impedance of the antenna,
- wherein the buffer amplifier has an input impedance greater than a resonated antenna impedance.

17. The system of claim 16, wherein the antenna comprises a self-resonant antenna.

* * * * *